(12) United States Patent
Chen et al.

(10) Patent No.: US 6,942,020 B2
(45) Date of Patent: Sep. 13, 2005

(54) HEAT DISSIPATION DEVICE

(75) Inventors: Chun-Chi Chen, Tu-chen (TW); Meng Fu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/890,049

(22) Filed: Jul. 12, 2004

(65) Prior Publication Data

US 2005/0011634 A1 Jan. 20, 2005

(30) Foreign Application Priority Data

Jul. 16, 2003 (TW) ........................................ 92212985 U

(51) Int. Cl.$^7$ .............................................. F28D 15/00
(52) U.S. Cl. ........................... 165/104.21; 165/104.26; 165/104.33; 165/80.4; 361/700; 361/697; 257/715
(58) Field of Search .................. 165/104.21, 104.26, 165/104.33, 185, 80.4, 80.3; 361/697, 699, 700; 257/714–715; 174/15.2

(56) References Cited

U.S. PATENT DOCUMENTS

| | | | | |
|---|---|---|---|---|
| 4,204,246 A | | 5/1980 | Arii et al. | |
| 5,651,414 A | * | 7/1997 | Suzuki et al. | 165/104.14 |
| 5,924,479 A | * | 7/1999 | Egbert | 165/104.14 |
| 5,925,929 A | | 7/1999 | Kuwahara et al. | |
| 6,084,772 A | * | 7/2000 | Pell et al. | 361/699 |
| 6,102,110 A | * | 8/2000 | Julien et al. | 165/104.33 |
| 6,167,619 B1 | * | 1/2001 | Beagle | 29/890.043 |
| 6,321,452 B1 | * | 11/2001 | Lin | 29/890.032 |
| 6,382,307 B1 | | 5/2002 | Wang et al. | |
| 6,394,175 B1 | * | 5/2002 | Chen et al. | 165/80.3 |
| 6,404,632 B1 | * | 6/2002 | Forkas | 361/703 |
| 6,435,266 B1 | | 8/2002 | Wu | |
| 6,469,894 B2 | * | 10/2002 | Ubukata | 361/700 |
| 6,542,364 B2 | | 4/2003 | Lai et al. | |
| 6,595,270 B2 | * | 7/2003 | Machiroutu et al. | 165/104.26 |
| 6,651,733 B1 | * | 11/2003 | Horng et al. | 165/80.3 |
| 6,651,734 B1 | * | 11/2003 | Liu | 165/80.3 |
| 6,749,011 B2 | * | 6/2004 | Horng et al. | 165/80.3 |
| 6,779,595 B1 | * | 8/2004 | Chiang | 165/104.33 |
| 6,796,373 B1 | * | 9/2004 | Li | 165/104.21 |
| 6,830,098 B1 | * | 12/2004 | Todd et al. | 165/104.33 |
| 2003/0173061 A1 | * | 9/2003 | Lai et al. | 165/80.4 |
| 2004/0035558 A1 | * | 2/2004 | Todd et al. | 165/104.26 |
| 2004/0050534 A1 | * | 3/2004 | Malone et al. | 165/80.3 |
| 2005/0073811 A1 | * | 4/2005 | Wang et al. | 361/688 |

* cited by examiner

Primary Examiner—Terrell McKinnon
(74) Attorney, Agent, or Firm—Wei Te Chung

(57) ABSTRACT

A heat dissipation device includes a plurality of fins (40), a post (20) and a plurality of heat pipes (30). Each fin defines an opening (42) and a plurality of punctures (44) spaced from the opening. The post is received in the openings of the fins. The heat pipes are engaged at opposite portions thereof with the post and the punctures of the fins.

15 Claims, 3 Drawing Sheets

HEAT DISSIPATION DEVICE

BACKGROUND OF THE INVENTION

1. Field of the Invention

The present invention relates to heat dissipation devices for removing heat from electronic components, and more particularly to a heat pipe type heat dissipation device.

2. Description of Related Art

Conventional heat dissipation devices used for removing heat from electronic components are mostly formed by extrusion of metallic material. Such kind of heat dissipation device commonly comprises a base, and a plurality of fins integrally extending from the base. The fins are relatively thick in comparison with distances defined between each two adjacent fins, due to inherent limitations in extrusion technology. This restricts the number of the fins that can be formed, and a total heat dissipation area that can be provided by the fins. Furthermore, a height of the fins is limited to about 13 times the distance between each two adjacent fins, also due to inherent limitations in extrusion technology.

In order to keep pace with these developments in electronics technology, assembled heat dissipation devices have been gaining in popularity. For example, China Patent No. 2462641Y provides an assembled heat dissipation device having a plurality of uniformly dimensioned individual plate fins evenly stacked together. This heat dissipation device can provide a large total heat dissipation area. However, the fins are connected together only by the attachment of the tabs of each fin in the indents of the adjacent fin. The fins are prone to be disengaged from each other when the heat dissipation device is subjected to shock or vibration during transportation or in operation. Part of or even the entire stack of fins may collapse.

With the continuing boom in electronics technology, numerous modern electronic components such as central processing units (CPUs) of computers can operate at very high speeds and thus generate large amounts of heat. The heat must be efficiently removed from the CPU; otherwise, abnormal operation or damage may result. The conventional heat removal way merely by conduct of heat is increasingly no longer able to adequately remove heat from these contemporary electronic components.

Meanwhile, heat pipes have been generally applied to enhance heat removal efficiency. FIG. 3 shows a heat dissipation device including a plurality of small heat pipes perpendicularly inserted into a base and a plurality of spaced fins individually perpendicularly engaged with the heat pipes. However, the engagement of the heat pipes with the base is limited by the thickness of the base. The total contacting area between the heat pipes and the fins is limited by the dimension of the heat pipes. Though the heat pipes inherently have a great heat-transfer capability, the heat dissipation device is not yet enhanced to remove heat from the CPU.

SUMMARY OF THE INVENTION

Accordingly, an object of the present invention is to provide a heat dissipation device which optimizes the heat removal capacity of the heat dissipation device.

In order to achieve the object set out above, a heat dissipation device in accordance with a preferred embodiment of the present invention comprises a plurality of fins, a post and a plurality of heat pipes. Each fin defines an opening and a plurality of punctures spaced from the opening. The post is received in the openings of the fins. The heat pipes are engaged at opposite portions thereof with the post and the punctures of the fins. In the present invention, the post has a great thermal engaging area with the fins and is sufficiently engaged with the heat pipes. Apparently, the heat conducting efficiency of the heat dissipation device of the present invention is greater than that of a conventional heat dissipating device as disclosed in FIG. 3. Furthermore, the post is received in the openings of the fins and the heat pipes are engaged with the fins in the punctures spaced from the openings. Thus, the heat on the fins is evenly distributed. This facilitates to dissipate heat from the fins to ambient space.

Other objects, advantages and novel features of the present invention will become more apparent from the following detailed description when taken in conjunction with the accompanying drawings, in which:

DETAILED DESCRIPTION OF THE INVENTION

Figure 1:
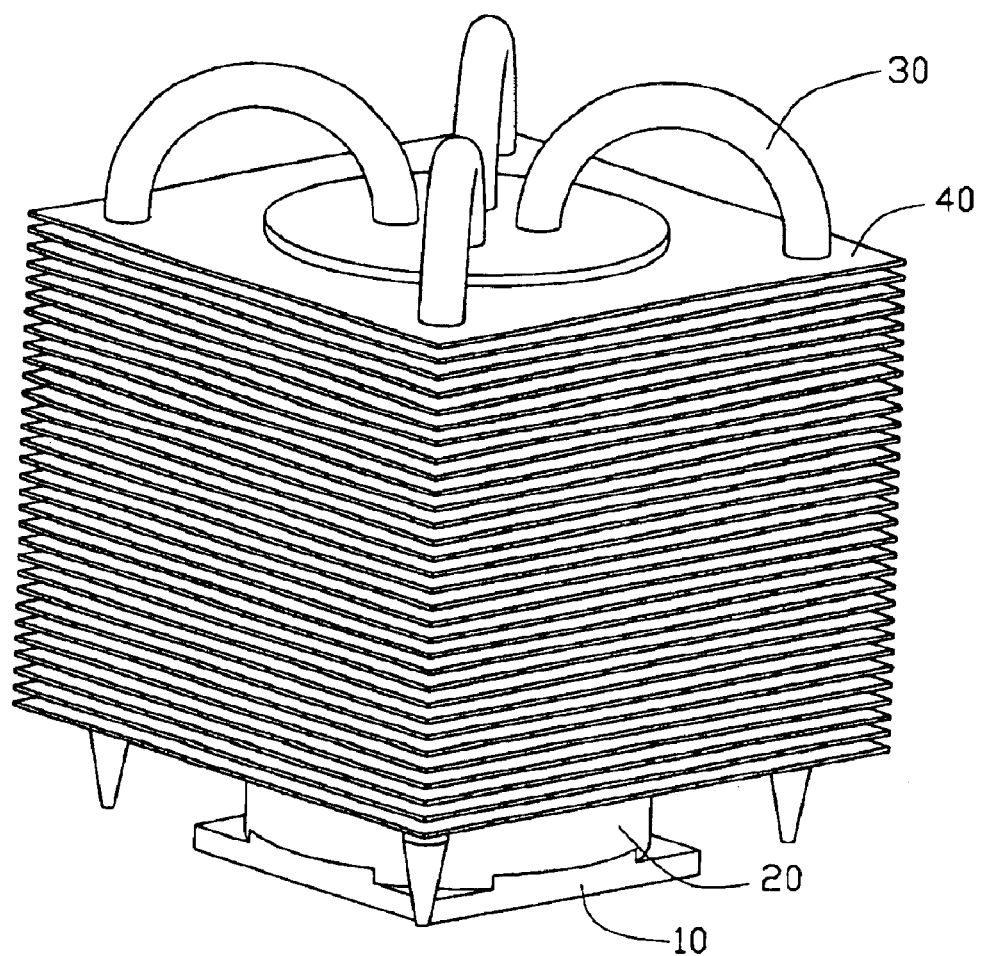
FIG. 1 is an assembled, isometric view of a heat dissipation device in accordance with the preferred embodiment of the present invention.
Figure 2:
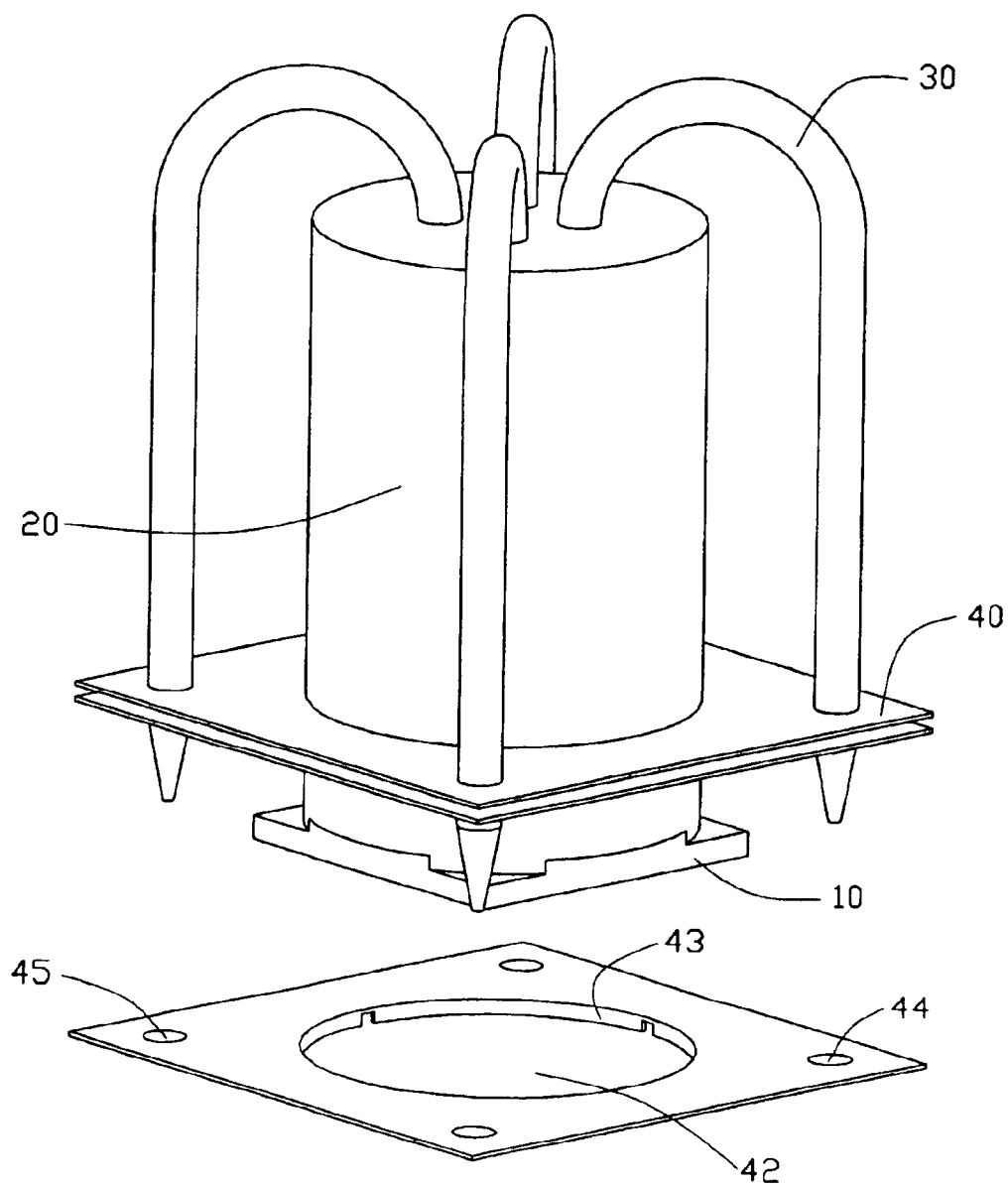
FIG. 2 is a partly assembled, isometric view of the heat dissipation device of FIG. 1.

Referring to FIGS. 1–2, a heat dissipation device in accordance with the preferred embodiment of the present invention comprises a base 10, a post 20, a plurality of heat pipes 30 and a plurality of parallel fins 40.

The base 10 is for conducting heat from an electronic component (not shown) to be cooled. The post 20 is perpendicularly attached to the base 10 for removing heat therefrom. The post 20 defines a plurality of holes (not labeled). Each fin 40 defines a substantial central opening 42 for receiving the post 20, and a plurality of punctures 44 around and spaced from the opening 42. Each heat pipe 30 has a substantially inverted U-shaped configuration and is engaged at opposite portions thereof within the corresponding hole of the post 20 and the corresponding puncture 14 of each fin 40. Each fin 40 further forms a flange 43 at a periphery of the opening 42 for increasing thermal engaging area with the post 20 and a plurality of collars 45 around the punctures 44 for increasing thermal engaging area with the heat pipes 30. The flanges 43 and the collars 45 define intervals between the fins 40. In the present invention, solder (not shown) is applied to solder the fins to the post 20 and to solder the heat pipes 30 to the fins 40.

In use of the heat dissipation device, the heat accumulated on the base 10 is transferred to the post 20. Then there are heat-transfers between the post 20 and the fins 50, and between the post 20 and the heat pipes 30 where engaged with the post 20. The heat accumulated on the heat pipes 30 is then transferred to the fins 40 where engaged with the heat pipes 30. The fins 50 finally dissipate heat thereon to ambient space.

In an alternative embodiment of the present invention, the post 20 can be directly attached to the electronic component, there being no base 10. The post 20 can have any reasonable shape.

Figure 3:
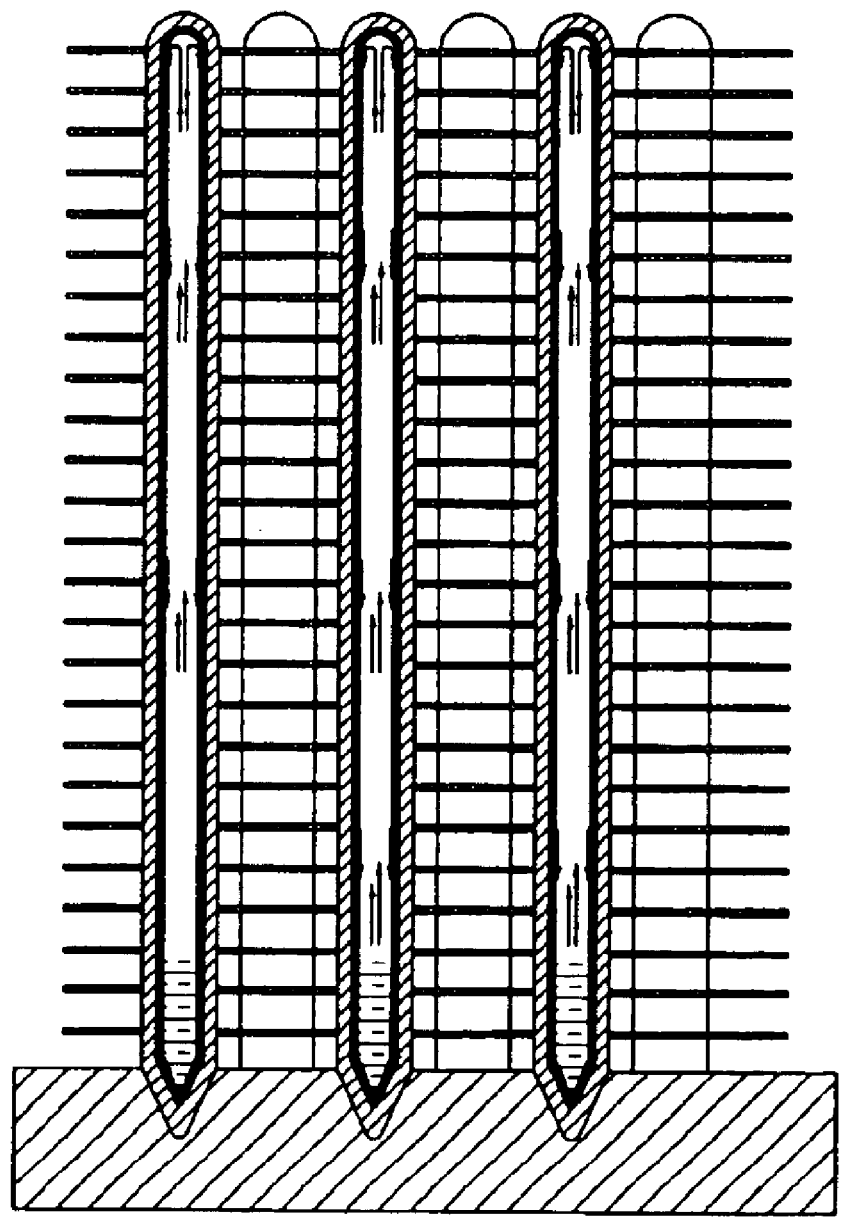
FIG. 3 is a cross sectional view of a conventional heat dissipation device.

In the present invention, the post 20 has a great thermal engaging area with the fins 40 and is sufficiently engaged with the heat pipes 30. Apparently, the heat conducting efficiency of the heat dissipation device of the present invention is greater than that of a conventional heat dissipating device as disclosed in FIG. 3. Furthermore, the post 20 is received in the central openings 42 of the fins 40 and the heat pipes 30 are engaged with the fins 40 in the punctures 44 around and spaced from the openings 42. Thus, the heat on the fins 40 is evenly distributed. This facilitates to dissipate heat from the fins 40 to ambient space.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a plurality of fins each defining an opening and a plurality of voids spaced from the opening;
    a post received in the openings of the fins, and
    a plurality of heat pipes engaging at opposite portions thereof with the post and the voids of the fins.

2. The heat dissipation device of claim 1, wherein the voids are punctures.

3. The heat dissipation device of claim 1, wherein the heat pipes are generally inverted U-shaped.

4. The heat dissipation device of claim 1, wherein each of the fins forms a flange at a periphery of the opening for increasing thermal engaging area with the post.

5. The heat dissipation device of claim 4, wherein the flanges define intervals between the fins.

6. The heat dissipation device of claim 1, wherein each of the fins forms collars around the voids for increasing thermal engaging area with the heat pipes.

7. The heat dissipation device of claim 6, wherein the collars define intervals between the fins.

8. The heat dissipation device of claim 1, wherein the opening is defined in a substantially central position of each of the fins, and the voids are around the opening.

9. The heat dissipation device of claim 1, further comprising a base.

10. The heat dissipation device of claim 9, wherein the post is perpendicularly attached on the base.

11. The heat dissipation device of claim 1, wherein the fins are soldered to the post.

12. The heat dissipation device of claim 1, wherein the heat pipes are soldered to the fins.

13. A heat dissipation device comprising:
    a planar base with an underside for engagement with a heat generating device;
    a solid post upwardly extending from the base;
    a plurality of spaced fins engageably surrounding the post in a parallel relation with one another; and
    a plurality of heat pipes having two ends respectively extending through said post and said fins.

14. The heat dissipation device of claim 13, wherein said two ends are essentially parallel to each other.

15. A heat dissipation device comprising:
    a planar base with an underside for engagement with a heat generating device;
    a solid post upwardly extending from the base in a vertical direction;
    a plurality of spaced fins arranged in a parallel relation with one another; and
    a plurality of U-shaped heat pipes having two ends respectively extending through said post and said fins; wherein
    said fins extend horizontally and contact the solid posts in a perpendicular manner.

* * * * *